United States Patent
Hattori et al.

(10) Patent No.: US 8,986,488 B2
(45) Date of Patent: Mar. 24, 2015

(54) PATTERN FORMATION METHOD AND POLYMER ALLOY BASE MATERIAL

(71) Applicant: Kabushiki Kaisha Toshiba, Tokyo (JP)

(72) Inventors: Shigeki Hattori, Yokohama (JP); Koji Asakawa, Kawasaki (JP); Hiroko Nakamura, Yokohama (JP); Ryota Kitagawa, Tokyo (JP); Yuriko Seino, Yokohama (JP); Masahiro Kanno, Yokohama (JP); Momoka Higa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/750,007

(22) Filed: Jan. 25, 2013

(65) Prior Publication Data

US 2013/0133825 A1     May 30, 2013

Related U.S. Application Data

(63) Continuation of application No. PCT/JP2011/066222, filed on Jul. 15, 2011.

(30) Foreign Application Priority Data

Jul. 28, 2010    (JP) ................................. 2010-169279

(51) Int. Cl.
*B32B 38/04*     (2006.01)
*B81C 1/00*      (2006.01)
(Continued)

(52) U.S. Cl.
CPC ..... *H01L 21/3081* (2013.01); *B81C 2201/0149* (2013.01); *B81C 1/00031* (2013.01); *H01L 21/0337* (2013.01)

USPC ....................................................... 156/272.2

(58) Field of Classification Search
CPC ............... G03F 7/26; G03F 7/40; G03F 7/42; B32B 37/065; B32B 37/30; B29C 65/14; B29C 65/1496
USPC ....................................................... 156/272.2
See application file for complete search history.

(56) References Cited

U.S. PATENT DOCUMENTS 6,565,763 B1    5/2003  Asakawa et al.
6,746,825 B2    6/2004  Nealey et al.
(Continued)

FOREIGN PATENT DOCUMENTS

JP       4-32104      2/1992
JP    2001-189014     7/2001
(Continued)

OTHER PUBLICATIONS

English-language International Search Report from Japanese Patent Office for International Application No. PCT/JP2011/066222, mailed Oct. 4, 2011.
(Continued)

*Primary Examiner* — Daniel McNally
(74) *Attorney, Agent, or Firm* — Finnegan, Henderson, Farabow, Garrett & Dunner, L.L.P.

(57) ABSTRACT

According to one embodiment, a pattern formation method is provided, the pattern formation includes: laminating a self-assembled monolayer and a polymer film on a substrate; causing chemical bonding between the polymer film and the self-assembled monolayer by irradiation with an energy beam to form a polymer surface layer on the self-assembled monolayer; and forming on the polymer surface layer a polymer alloy having a pattern of phase-separated structures.

13 Claims, 6 Drawing Sheets

(a)

(b)

(51) Int. Cl.
*H01L 21/308* (2006.01)
*H01L 21/033* (2006.01)

(56) References Cited

U.S. PATENT DOCUMENTS

| | | |
|---|---|---|
| 7,252,862 B2 | 8/2007 | Jung et al. |
| 7,267,932 B2 | 9/2007 | Park et al. |
| 7,517,466 B2 | 4/2009 | Asakawa et al. |
| 7,521,090 B1 | 4/2009 | Cheng et al. |
| 7,604,916 B2 | 10/2009 | Wolk et al. |
| 7,759,042 B2 | 7/2010 | Wolk et al. |
| 7,901,866 B2 | 3/2011 | Ito |
| 2002/0168548 A1 | 11/2002 | Sakurai et al. |
| 2004/0241590 A1 | 12/2004 | Park et al. |
| 2005/0079283 A1 | 4/2005 | Sakurai et al. |
| 2006/0046156 A1 | 3/2006 | Amako et al. |
| 2007/0224819 A1 | 9/2007 | Sandhu |
| 2007/0224823 A1 | 9/2007 | Sandhu |
| 2008/0038542 A1 | 2/2008 | Park et al. |
| 2008/0107993 A1 | 5/2008 | Wolk et al. |
| 2008/0290067 A1 | 11/2008 | Yoshida et al. |
| 2009/0311633 A1 | 12/2009 | Ito |
| 2009/0322219 A1 | 12/2009 | Wolk et al. |
| 2010/0055390 A1 | 3/2010 | Ishizuka et al. |
| 2010/0151393 A1 | 6/2010 | Kim |
| 2011/0117744 A1 | 5/2011 | Ito |
| 2011/0186544 A1 | 8/2011 | Endou et al. |
| 2012/0238109 A1 | 9/2012 | Hattori et al. |

FOREIGN PATENT DOCUMENTS

| | | |
|---|---|---|
| JP | 2002-334414 | 11/2002 |
| JP | 2006-93644 | 4/2006 |
| JP | 3967114 | 6/2007 |
| JP | 2008-96596 | 4/2008 |
| JP | 2009-73809 | 4/2009 |
| JP | 2010-58314 | 3/2010 |
| JP | 2010-509756 | 3/2010 |
| JP | 2011-129874 | 6/2011 |
| WO | WO 2007/127496 A2 | 11/2007 |
| WO | WO 2010/055601 A1 | 5/2010 |

OTHER PUBLICATIONS

Kim, S. O. et al., "Epitaxial Self-Assembly of Block Copolymers on Lithographically Defined Nanopatterned Substrates," Nature, vol. 424, pp. 411-414, (2003).

Edwards, E. W. et al., "Precise Control over Molecular Dimensions of Block-Copolymer Domains Using the Interfacial Energy of Chemically Nanopatterned Substrates," Advanced Materials, vol. 16, No. 15, pp. 1315-1319, (2004).

Ruiz, R. et al., "Density Multiplication and Improved Lithography by Directed Block Copolymer Assembly," Science, vol. 321, pp. 936-939, (2008).

Prucker, O. et al., "Photochemical Attachment of Polymer Films to Solid Surfaces via Monolayers of Benzophenone Derivatoves," J. Am. Chem. Soc., vol. 121, No. 38, pp. 8766-8770, (1999).

Welander, A. M. et al., "Rapid Directed Assembly of Block Copolymer Films at Elevated Temperatures," Macromolecules, vol. 41, No. 8, pp. 2759-2761, (2008).

Asakawa, K. et al., "Nano-Patterning with Microdomains of Block-Copolymers using Reactive-Ion Etching," [133.002], APS March Meeting, 1 Sheet, (2000).

International Preliminary Report on Patentability and Written Opinion issued by the International Bureau of WIPO on Mar. 21, 2013.

Taiwanese Office Action issued by the Taiwanese Intellectual Property Office on Feb. 25, 2014, for Taiwanese Patent Application No. 100126670, and English-language translation thereof.

First Office Action issued by the State Intellectual Property Office of the People's Republic of China on Nov. 15, 2014, for Chinese Patent Application No. 201180035598.2, and English-language translation thereof.

(d)

(e)

PATTERN FORMATION METHOD AND POLYMER ALLOY BASE MATERIAL

CROSS-REFERENCE TO RELATED APPLICATION

This application is based upon and claims the benefit of priority from prior Japanese Patent Application No. 2010-169279, filed on Jul. 28, 2010 in Japan and PCT/JP 2011/066222 filed on Jul. 15, 2011, the entire contents of which are incorporated herein by reference.

FIELD

Embodiments of the present invention relate to a pattern formation method and a polymer alloy base material.

BACKGROUND

In semiconductor device production processes such as that for producing LSI, the microfabrication technology to which lithography is adopted has heretofore been employed. Since more microscopic processing will positively be in demand, a reduction in wavelength of a light source and enhancement of performance of a resist in lithography are in progress. However, it becomes increasingly difficult to improve resolution with these measures.

Meanwhile, a microfabrication technology utilizing phase-separated structures of a block copolymer has been attracting attention. In the microfabrication technology, regular alignment of the phase separated structures of the block copolymer is required. The following methods have been proposed for attaining the regular alignment of phase-separated structures of block copolymer.

For instance, there has been known a method of forming a microphase-separated pattern of a block copolymer, including: forming a self-assembled monolayer (SAM) on a substrate; coating a photoresist on the substrate to form a line-and-space resist pattern by lithography; performing selective irradiation with an X-ray under an oxygen atmosphere by using the resist pattern as a mask to achieve chemical modification of a part of the SAM; removing the resist pattern; and coating the SAM with the block copolymer, followed by annealing.

Further, there has been known a method of forming a microphase-separated pattern of a block copolymer, including: forming a SAM on a substrate; selectively exposing a part of the SAM by interference exposure to form a chemically modified dot pattern; and coating the SAM with the block copolymer, followed by annealing.

However, since these methods which utilize the SAM are susceptible to a fluctuation in SAM coating rate, and since chemical potential of a molecule forming the SAM is limited, the methods have problems of poor surface free energy controllability of the SAM and unstable alignment of orientation of the microphase-separated pattern of the block copolymer.

Further, there has been known a method of forming a microphase-separated pattern of a block copolymer, including: forming on a substrate a monolayer which is formed of a polymer compound and is called polymer brush by heating for a long time; coating a photoresist on the substrate to form a line-and-space resist pattern by lithography; performing selective irradiation with an X-ray under an oxygen atmosphere by using the resist pattern as a mask to remove a part of the polymer brush; removing the resist pattern; and coating the polymer brush with the block copolymer, followed by annealing.

Further, there has been known a method of forming a microphase-separated pattern of a block copolymer, including: forming a polymer brush on a substrate; coating an electron beam resist on the substrate to form a dot pattern by lithography; performing irradiation with oxygen plasma by using the dot pattern of the electron beam resist as a mask to remove a part of the polymer brush; eliminating the resist pattern; and coating the SAM with a block copolymer, followed by annealing. The method discloses that a dot pitch of the dot pattern of the block copolymer can be narrower than a dot pitch of the dot pattern formed on the electron beam resist.

In these methods using the polymer brush, since the polymer is spread on the surface to form the monolayer, it is possible to stably perform the control of the surface free energy owing to the SAM formed of the silane coupling agent. However, it is necessary to allow a chemical reaction between a hydroxyl group at a polymer end and a Si substrate surface to sufficiently proceed during the formation of the polymer brush and to apply heat energy which sufficiently exceeds activation energy required for the chemical reaction and enables the hydroxy group in the vicinity of Si to sufficiently diffuse at a temperature at which heat decomposition of the polymer does not occur. Therefore, the methods are not practical as the microfabrication technology for semiconductor devices and the like since they require the long-time heat treatment.

Further, there has been reported a phenomenon that an interface part of a polymer remains after the polymer is rinsed with an organic solvent to which the polymer is easily dissolved, when a SAM of a silane coupling agent having a benzophenone structure is formed on a substrate; a polymer is coated on the substrate; and light irradiation is performed to cause a crosslinking reaction between the polymer layer at the interface part which contacts the SAM and the benzophenone. However, the material is not contemplated as the one which is capable of orientation alignment of the microphase-separated pattern of block copolymer and is not proven effective.

DETAILED DESCRIPTION

According to one embodiment, a pattern formation method includes: laminating a self-assembled monolayer and a polymer film on a substrate; causing chemical bonding between the polymer film and the self-assembled monolayer by irradiation with an energy beam to form a polymer surface layer on the self-assembled monolayer; and forming on the polymer surface layer a polymer alloy having a pattern of phase-separated structures.

First Embodiment

Figure 1A:
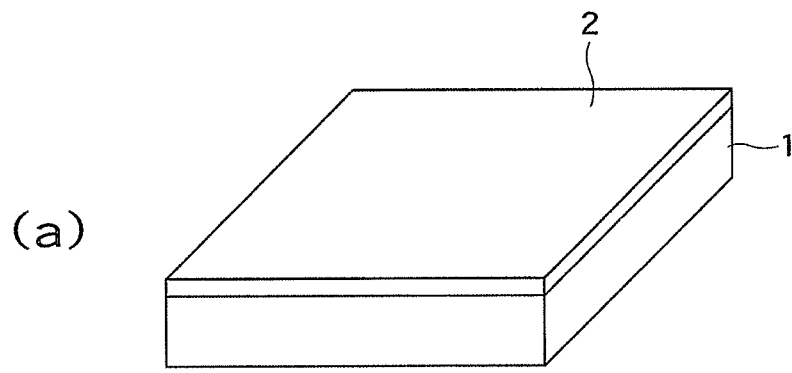
FIGS. 1A (a) to 1A (c) are perspective views showing a polymer alloy pattern formation method according to the first embodiment.
Figure 1A:
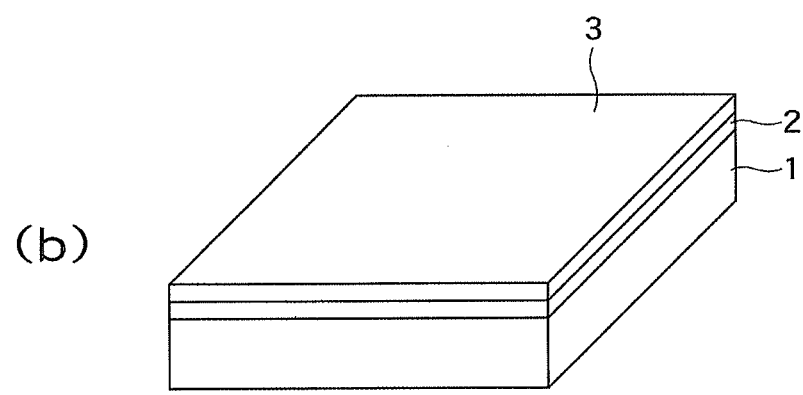
Figure 1A:
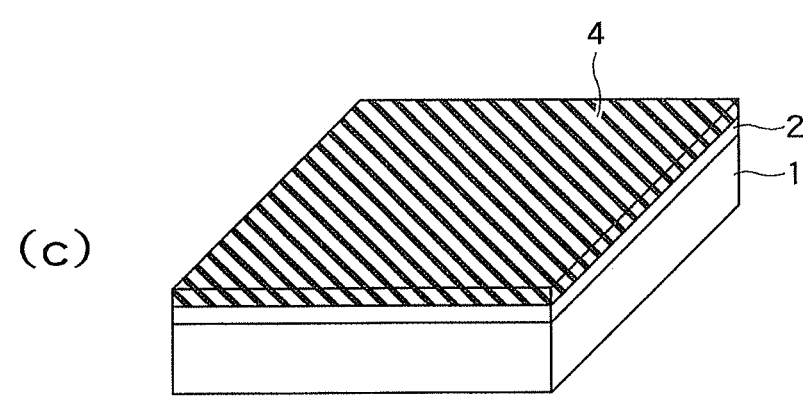
Figure 1B:
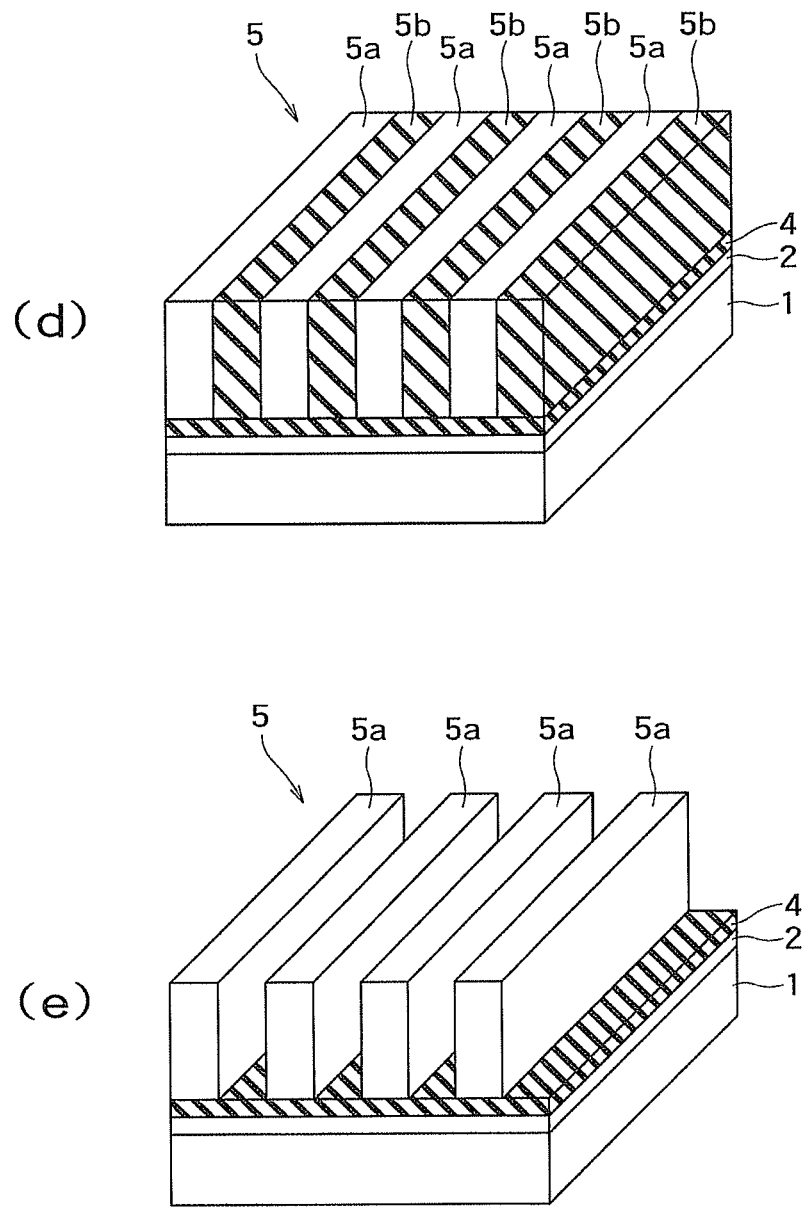
FIGS. 1B (d) and 1B (e) are perspective views showing a polymer alloy pattern formation method according to the first embodiment.

FIGS. 1A (a) to 1A (c) and FIGS. 1B (d) and 1B (e) are perspective views showing a polymer alloy pattern formation method according to the first embodiment.

As shown in FIG. 1A (a), a self-assembled monolayer 2 is formed on a substrate 1.

As the substrate 1, a silicon wafer, a doped silicon wafer, a silicon wafer in which an insulation layer, or a metal layer serving as an electrode or a wiring is formed on a surface, a mask blank, or a semiconductor wafer of the III-V group compound such as GaAs and AlGaAs may be used. Further, a chrome or chrome oxide-deposited substrate, an aluminum-deposited substrate, an IBSPG-coated substrate, a spin-on-glass (SOG)-coated substrate, or a SiN-coated substrate may be used. Particularly, from the viewpoint of easiness of forming the self-assembled monolayer 2, the substrate 1 may preferably have many hydroxy groups on its surface.

The self-assembled monolayer film 2 may preferably be formed of a material which readily reacts with a hydroxy group on a surface of a metal or a metal oxide formed on the silicone substrate, such as a material containing a silane coupling agent.

The self-assembled monolayer film 2 may preferably be formed of a photopolymerization initiator which efficiently absorbs an energy beam such as a UV ray and an electron beam to cause a crosslinking reaction with a polymer contacting the photopolymerization initiator, such as a material having a benzophenone structure.

The material having benzophenone structure is represented by the following general formula Ia. R in the general formula Ia is a straight chain alkyl group having Si—F, Si—Cl, Si—Br or Si—OH, Si—OCH$_3$, Si—OC$_2$H$_5$, Si—OC$_3$H$_7$ at a terminal and may have an ether bonding in the alkyl chain.

[Chemical formula 1]

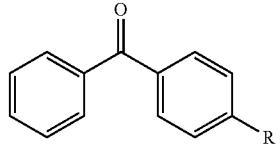

(GENERAL FORMULA Ia)

The material represented by the general formula Ia efficiently absorbs the energy beam since the material includes benzophenone structure, and electrons on an n-orbital of a carbonyl group of the benzophenone are excited by the π*-orbital to react with the alkyl chain of the polymer contacting the material. In the alkyl chain of the polymer in contact, tertiary carbon is the most reactive. Therefore, crosslinking between the self-assembled monolayer 2 formed of the material represented by the general formula Ia and the polymer is attained by the irradiation with energy beam.

Further, as the material for the self-assembled monolayer 2, those which are conveniently synthesized at a low cost are preferred among the materials represented by the general formula Ia. As the materials, silane coupling agents containing a benzophenone structure represented by the following general formula Ib are usable.

[Chemical formula 2]

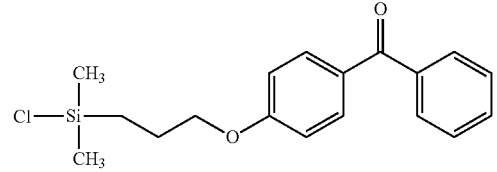

(GENERAL FORMULA Ib)

As a method for forming the self-assembled monolayer 2, spin coating, dip coating, gas phase growth, a doctor blade method, curtain coating, or the like may be employed. It is preferable to perform preprocessing such as irradiation of the substrate 1 with UV ray in order to remove organic impurities deposited on the surface of the substrate 1 before forming the self-assembled monolayer 2.

In the case of employing the spin coating for forming the self-assembled monolayer 2, the self-assembled monolayer 2 is formed by spin-coating the material for the self-assembled monolayer 2 as it is or diluted with a solvent on the substrate 1, and then performing baking on a hot plate or the like as required. The material for the self-assembled monolayer 2 which is excessively absorbed by the substrate 1 over the monolayer is washed away.

In the spin coating, a concentration of the material for the self-assembled monolayer 2 when diluted with a solvent may preferably be 1 to 30 wt % without particular limitation thereto. It is preferable to adjust the concentration depending on a degree of wet-spreading on the substrate 1.

The solvent to be used may be varied depending on the material for the self-assembled monolayer 2 and may be those which do not cause any reaction with the material for the self-assembled monolayer 2. As the solvent, aromatic hydrocarbons such as toluene, xylene, mesitylene; cycloalkanes such as cyclohexane, cycloheptane, cyclooctane, and cyclononane; alkanes such as hexane, heptane, octane, nonane, and decane; alkylalcohols such as methanol, ethanol, 1-propanol, and 2-propanol; and the like are usable.

In addition to the above-described solvents, organic solvents such as ketones, cellosolves, and esters which are generally used as a solvent for a photoresist are usable from the viewpoints of reactivity, wettability with the substrate 1, and volatility. Examples of the ketones include cyclohexanone, acetone, ethylmethylketone, methylisobutylketone, and the like. Examples of cellosolves include methyl cellosolve, methylcellosolve acetate, ethylcellosolve acetate, butylcellosolve acetate, and the like. Examples of esters include ethyl acetate, butyl acetate, isoamyl acetate, γ-butyrolactone, and 3-methyl methoxypropionate.

As the solvent, 2 or more kinds of the solvents may be used in combination as required. A dehydrated solvent may preferably be used from the viewpoint of reactivity with a functional group on a surface of the substrate 1.

A temperature at which the baking on hot plate etc. is performed may preferably be 100° C. to 200° C. in order that energy which exceeds activation energy required for attaining chemical binding of the material for the self-assembled monolayer 2 to the functional group on the surface of the substrate 1 is produced.

The solvent to be used for washing away (rinsing off) the material for the self-assembled monolayer 2 which is excessively absorbed by the substrate 1 over the monolayer may be the one used for diluting the material for the self-assembled monolayer 2.

In the case of employing the dip coating for the formation of the self-assembled monolayer 2, the material for the self-assembled monolayer 2 is diluted with a solvent, and the substrate 1 is dipped into the diluted solution for a certain period of time to form the self-assembled monolayer 2.

In the dip coating, a concentration of the material for the self-assembled monolayer 2 when the solvent is diluted may preferably be 1 to 30 wt %.

The solvent to be used may preferably be those which do not cause any reaction with the material for the self-assembled monolayer 2 as is the case with the solvent used for the spin coating. As the solvent, aromatic hydrocarbons such as toluene, xylene, mesitylene; cycloalkanes such as cyclohexane, cycloheptane, cyclooctane, and cyclononane; alkanes such as hexane, heptane, octane, nonane, and decane; alkylalcohols such as methanol, ethanol, 1-propanol, and 2-propanol; and the like are usable. A dehydrated solvent may preferably be used from the viewpoint of reactivity with the functional group on the surface of the substrate 1.

The dipping time may preferably be 1 minute to 60 minutes though it may be varied depending on the concentration and the reactivity. From the viewpoint of a reaction speed, the solution may be heated before dipping the substrate 1. A dipping temperature is set to a temperature which is equal to or lower than a boiling point of the solvent and does not cause decomposition of the material for the self-assembled monolayer 2 before the reaction with the functional group on the surface of the substrate 1 and is ordinarily adjusted to 40° C. to 100° C.

The solvent to be used for washing away (rinsing off) the material for the self-assembled monolayer 2 which is excessively absorbed by the self-assembled monolayer 2 over the monolayer may be the one used for the dipping. Preferably, the solvent is blown away by blowing an inert gas such as nitrogen and argon after the rinsing or, in some cases, is removed by heating on a hot plate.

In the case of employing the gas phase growth for the formation of the self-assembled monolayer 2, the material for the self-assembled monolayer 2 is brought into a gaseous state by reducing an air pressure, increasing a temperature, or performing both of them, and then the substrate 1 is introduced into and exposed to the gaseous state for a certain period of time to form the self-assembled monolayer 2 on the surface of the substrate 1.

In the gas phase growth, the reduction of air pressure, the increase of temperature, or both of them is/are performed depending on vapor pressure characteristics of the material for the self-assembled monolayer 2 in order to bring the material into the gaseous state. It is preferable to perform the pressure reduction and then the temperature increase until the change into the gaseous state from the viewpoint of stability of the material though it depends on the boiling point of the monolayer formation material to be used. The substrate 1 is introduced into or placed beforehand in a space in which the material for the self-assembled monolayer 2 in the gaseous state is present, and the surface of the substrate 1 may preferably be exposed for 1 hour to 5 hours.

After the exposure of the substrate 1, the material for the self-assembled monolayer 2 which is excessively absorbed by the substrate 1 over the monolayer may be washed away with a solvent as required. As the solvent, the one used in the above-described spin coating may preferably be used.

Next, as shown in FIG. 1A (b), a polymer film 3 is formed on the self-assembled monolayer 2.

As a material for the polymer film 3, those which are chemically bonded to the self-assembled monolayer 2 by irradiation with a high energy beam and have surface energy which is suitable for regulating orientation of microphase-separated structures of a polymer alloy to be formed on a surface thereof may be used.

Next, as shown in FIG. 1A (c), the substrate 1 is irradiated with the high energy beam to cause the chemical bonding (crosslinking) of the polymer film 3 to the self-assembled monolayer 2, thereby forming a polymer surface layer 4 on the self-assembled monolayer 2. After the formation of the polymer surface layer 4, a portion of the polymer film 3 on the polymer surface layer 4, which is not chemically bonded to the self-assembled monolayer 2, may be removed.

The energy beam with which the self-assembled monolayer 2 is irradiated is not particularly limited insofar as the energy beam has a wavelength to which the material for the self-assembled monolayer 2 is sensitive. More specifically, a UV ray, an i-line, h-line, or g-line of a mercury lamp, light of a xenon lamp, a deep UV ray (e.g. an excimer laser beam such as KrF or ArF), an X-ray, synchrotron orbital radiation (SR), an electron beam, a γ-beam, and an ion beam are usable.

Next, as shown in FIG. 1B (d), a polymer alloy 5 having phase-separated structures is formed on the polymer surface layer 4. By forming the polymer alloy 5 on the polymer surface layer 4, it is possible to enhance vertical orientation of the phase-separated structures of the polymer alloy 5 as compared to the case of directly forming the polymer alloy 5 on the self-assembled monolayer 2.

The polymer alloy 5 may be a block copolymer, a polymer obtained by blending homopolymers of different kinds, a polymer obtained by blending a homopolymer and a block copolymer, or a graft copolymer, for example.

The polymer alloy 5 has the phase-separated structures formed of a first phase 5a and a second phase 5b. The polymer alloy 5 is a block copolymer in which the first phase 5a is formed of a block chain of polystyrene and the second phase 5b is formed of a block chain of polybutadiene or a block copolymer in which the first phase 5a is formed of a block chain of polystyrene and the second phase 5b is formed of a block chain of polymethylmethacrylate, for example. Alternatively, the polymer alloy 5 is a block copolymer in which the first phase 5a is formed of a block chain of polynorbornadiene and the second phase 5b is formed of a block chain of polymethylmethacrylate.

Further, the first phase 5a and the second phase 5b may preferably have a lamellar structure. The phase-separated structures of the polymer alloy 5 may be formed of 3 or more phases.

A method for forming the polymer alloy 5 is not particularly limited. For example, spin coating, dip coating, a doctor blade method, curtain coating, or a method other than the above may be employed. After coating a solution of the polymer alloy 5 on the polymer surface layer 4, the solvent may be removed by heating on a hot plate as required. A temperature for the heating may preferably be 70° C. to 120° C.

In order to attain phase separation of the polymer alloy 5, annealing at a temperature equal to or higher than a glass transition temperature of the polymer alloy 5 is generally performed. For example, a phase separation speed of a block copolymer is known to be correlated with an annealing temperature (for example, see A. M. Welander et al, Macromolecules, 41, 2759-2761, 2008). When the annealing temperature exceeds the order-disorder transition temperature (ODT), a disorder structure is formed to fail to obtain the phase-separated structures. Therefore, it is preferable to perform the annealing at the temperature which is appropriate for attaining an appropriate phase separation speed. Though it depends on a molecular weight and a kind of the polymer alloy 5, the annealing temperature may preferably be 130° C.

to 280° C. The annealing is performed by using an oven or a hot plate. In the case of using the oven, the annealing is performed at a low temperature for a long time. In the case of using the hot plate, the annealing is performed at a high temperature for a short time.

In the case of performing the annealing under an atmosphere where a very small amount of a reactive gas such as oxygen is present, the polymer alloy 5 may be decomposed when the annealing temperature is high. Therefore, from the viewpoint of preventing the decomposition of the polymer alloy 5, it is preferable to perform the annealing under the atmosphere of an inert gas such as argon and nitrogen. When so required, the annealing may be performed under a forming gas atmosphere containing about 3% of hydrogen.

After that, as shown in FIG. 1B (e), either one of the first phase 5a or the second phase 5b of the polymer alloy 5 may be selectively removed. By selectively removing either one of the first phase 5a or the second phase 5b forming the lamellar structure, it is possible to form a line-and-space pattern on the polymer alloy 5. In the case where the polymer alloy is formed of 3 or more phases, a part of the phases is removed.

In the case of performing the above-described process step, each of the first phase 5a and the second phase 5b is necessarily formed of a block chain which enables the selective removal of either one of the first phase 5a or the second phase 5b by a certain method. For example, the phase formed of block chain of polybutadiene is known to be selectively removed by performing an ozone treatment on the block copolymer having the phase formed of block chain of polystyrene and the phase formed of block chain of polybutadiene. Further, the phase formed of block chain of polymethylmethacrylate is known to be selectively removed by performing reactive ion etching (RIE) using a reactive gas such as $O_2$ and $CF_4$ on the block copolymer having the phase formed of block chain of polystyrene and the phase formed of block chain of polymethylmethacrylate (for example, see K. Asakawa et al., APS March Meeting, 2000).

Accordingly, in the case where the polymer alloy 5 is the block copolymer in which the first phase 5a is formed of block chain of polystyrene and the second phase 5b is formed of block chain of polybutadiene, it is possible to leave only the first phase 5a by selectively removing the second phase 5b by the ozone treatment. Further, in the case where the polymer alloy 5 is the block copolymer in which the first phase 5a is formed of block chain of polystyrene and the second phase 5b is formed of block chain of polymethylmethacrylate or in the case where the polymer alloy 5 is the block copolymer in which the first phase 5a is formed of block chain of polynorbornadiene and the second phase 5b is formed of block chain of polymethylmethacrylate, it is possible to leave only the first phase 5a by selectively removing the second phase 5b by the RIE using reactive gas such as $O_2$ and $CF_4$.

Other than the method of performing the ozone treatment or the RIE, a method of performing a heat treatment or wet etching may be employed. In the case of using as the pattern-forming material a block copolymer having a polymer chain of which a main chain is cut by the irradiation with energy beam and a polymer chain which is hardly decomposed by the energy beam, the layer is irradiated with light or an electron beam to cut the main chain of one of the polymer phases forming the microphase-separated structures, and then evaporation by heating or wet etching is performed to selectively remove the polymer phase.

In the method employing wet etching, it is possible to selectively remove one of the first phase 5a and the second phase 5b by using a developer which is capable of selectively removing one of the first phase 5a and the second phase 5b without performing the irradiation with energy beam before performing the wet etching.

The developer may be an organic developer or an aqueous developer (alkaline developer). Examples of the organic developer include alcohols such as methanol, ethanol, and isopropanol; ketones such as cyclohexanone, acetone, ethylmethylketone, and methylisobutylketone; cellosolves such as methyl cellosolve, methylcellosolve acetate, ethylcellosolve acetate, and butylcellosolve acetate; esters such as ethyl acetate, butyl acetate, isoamyl acetate, γ-butyrolactone, and 3-methyl methoxypropionate. The above-described solvents may be used in combination of 2 or more kinds thereof.

As the aqueous developer, an organic alkaline solution or an inorganic alkaline solution may be used. Examples of the organic alkaline solution include a tetramethylammonium hydroxide solution, a tetraethylammonium hydroxide solution, a choline solution, and the like, and examples of the inorganic alkaline solution include a potassium hydroxide solution, a sodium hydroxide solution, and the like. A concentration of the alkaline developer is not limited.

Further, an arbitrary additive may be added to the developer as required. For example, a surfactant may be added to reduce a surface tension of the developer, or a neutral salt may be added to make the developer active. Further, a temperature of the developer may be arbitrarily set, and cold water or warm water may be used.

The remaining first phase 5a may be used as a base layer, i.e. as a wafer forming the substrate 1, a metal layer or an insulation layer on a wafer, or a mask for etching.

Hereinafter, a specific example of the present embodiment will be described. In the specific example, a monolayer of 4-(3'chlorodimethylsilyl)propyloxybenzophenone (CSBP) as the self-assembled monolayer 2 was formed on a silicon wafer as the substrate 1, and a polymer film as the polymer film 3 was formed on the monolayer. The CSBP monolayer and the polymer film were exposed to an ArF excimer laser to form the polymer surface layer as the polymer surface layer 4, and lamellar microphase-separated structures of a block copolymer were formed as the polymer alloy 5.

To start with, a three-necked flask was charged with commercially available 4-hydroxybenzophenone (39.6 g) and potassium carbonate (28 g), followed by argon substitution. Subsequently, dehydrated acetone (120 ml) was added, followed by well stirring, and then allyl bromide (18.6 ml) was added. Stirring was performed at 60° C. for 8 hours. After that, the mixture was cooled to a room temperature, and pure water was added, followed by stirring. Extraction with diethylether (100 ml) was performed twice. Extraction-and-washing with a 10% NaOH solution (100 ml) was performed twice, followed by drying over sodium sulfate. The solvent was removed by using an evaporator to obtain a pale yellow residue. The residue was recrystallized from methanol, followed by suction filtration, and then drying in vacuum was performed to obtain 4-allyloxybenzophenone (hereinafter referred to as ABP) which was a pure product (weight: 43.7 g, yield: 91.9%).

ABP is represented by the following chemical formula.

[Chemical formula 3]

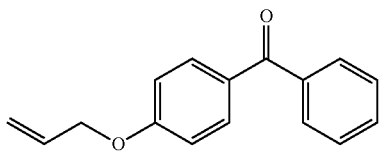

Next, a three-necked flask was charged with the obtained ABP (2 g) and 10% Pt—C (10 mg), followed by argon substitution. Dimethylchlorosilane (20 ml) was added to the mixture, followed by stirring. The stirring was performed at 40° C. for 5 hours. After that, the mixture was cooled to a room temperature, and excessive dimethylchlorosilane was removed in vacuum to obtain 4-(3'chlorodimethylsilyl)propyloxybenzophenone (hereinafter referred to as CSBP) which was a residual oily product. The oily product CSBP was dissolved into dehydrated toluene in use, and a catalyst was filtered off to use the filtrate as it is as a surface treatment solution for the silicon wafer.

CSBP is represented by the following chemical formula.

[Chemical formula 4]

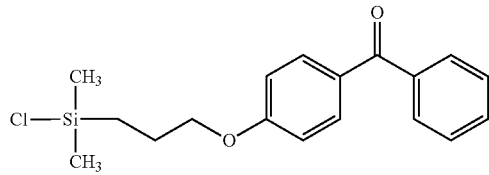

Next, a toluene solution (2.26 mM, 4 ml) of CSBP was dropped onto the silicon wafer corresponding to the substrate 1, followed by dropping a toluene solution (0.247 M, 2 ml) of triethylamine, and then the silicon wafer was left to stand for 1 minute. The solutions were spun off. After that, a whole surface of the silicon wafer was rinsed with cyclohexanone, and a polymer solution for a polymer film corresponding to the polymer film 3 was spin-coated. The polymer solution for polymer film was dissolved into toluene and coated at 2000 rpm. After the coating, baking at 110° C. was performed for 90 seconds to obtain a silicon wafer on which the self-assembled monolayer of CSBP corresponding to the self-assembled monolayer 2 and further the polymer film corresponding to the polymer film 3 were formed.

A concentration of the polymer solution for polymer film was adjusted to 1 wt %. As a polymer for the polymer film, P9225-SMMAran purchased from Polymer Source Inc., which is a random copolymer (PS-r-PMMA) of polystyrene (PS) and polymethylmethacrylate (PMMA), was used. P9225-SMMAran has a number average molecular weight (Mn) of 7000, a dispersion degree (Mw/Mn) of 1.20, and a ratio of the PS portion to the entire molecular weight (f(PS)) of 0.59.

Next, the obtained polymer film was subjected to exposure using an ArF excimer laser with an exposure amount of 10 to 490 mJ/cm$^2$. After the exposure, an entire silicon wafer surface was rinsed with cyclohexanone to obtain a polymer surface layer corresponding to the polymer surface layer 4.

A solution of a block copolymer was separately prepared. As the block copolymer, P189-SMMA purchased from Polymer Source Inc., which is a block copolymer (PS-b-PMMA) of polystyrene (PS) and polymethylmethacrylate (PMMA), was used. P189-SMMA has a number average molecular weight (Mn) of PS block and PMMA block of 86500, a dispersion degree (Mw/Mn) of 1.08. A ratio of the PS portion to the entire molecular weight (f(PS)) of 0.54.

A concentration of a polyethylene glycol monomethyl ether acetate (PGMEA) solution of the block copolymer was adjusted to 2.0 wt %, and the solution was spin-coated on the polymer surface layer at 2000 rpm, followed by baking at 110° C. for 90 seconds on a hot plate, thereby forming a block copolymer corresponding to the polymer alloy 5.

Next, phase separation of the block copolymer into a PS phase formed of a block chain of polystyrene and a PMMS phase formed of a block chain of polymethylmethacrylate was attained by performing annealing at 220° C. under a nitrogen atmosphere for 1 minute using a hot plate baker. A region of 500 nm×500 nm (500 nm square) of a surface of each of samples was measured with a tapping mode by using an atomic force microscope (Nanoscope III) and using a silicon chip [NCH-50] as a cantilever, and vertical orientation of the lamellar microphase-separated structures was evaluated from the obtained phase image.

As a result, lamellar vertical orientation which was free from fluctuation was confirmed in the whole exposed region, and no defect of the vertical orientation was found in the observed region.

Further, the PMMA phase having the higher etching rate than the PS phase was selectively removed by performing RIE using $O_2$ gas on the obtained block copolymer having the phase-separated structures.

Furthermore, the PMMA phase having the higher rate of solution than the PS phase was selectively removed by dipping the obtained block copolymer having the phase-separated structures to a 1:1 mixture solution of isopropyl alcohol (IPA) and methylisobutylketone (MIBK).

COMPARATIVE EXAMPLE 1

A polyethylene glycol monomethyl ether acetate (PGMEA) solution having concentration of 2 wt % of the block copolymer (P189-SMMA) of PS and PMMA, which is the same as that of the above-described specific example, was prepared and was directly coated on a silicon wafer without forming any polymer surface layer, and annealing at 220° C. was performed for 1 minute. However, the lamellar vertical orientation was not confirmed at all in the block copolymer formed directly on the silicon wafer.

From the above result, it is considered that the pattern formation method and formation material of the present embodiment have high controllability of phase-separated structures of the block copolymer.

Second Embodiment

The second embodiment is different from the first embodiment by the feature of forming a polymer alloy 5 after forming a pattern on a polymer surface layer 4. Descriptions of the materials, the production methods, and the like of the component parts which are the same as those of the first embodiment are simplified or are not repeated.

Figure 2A:
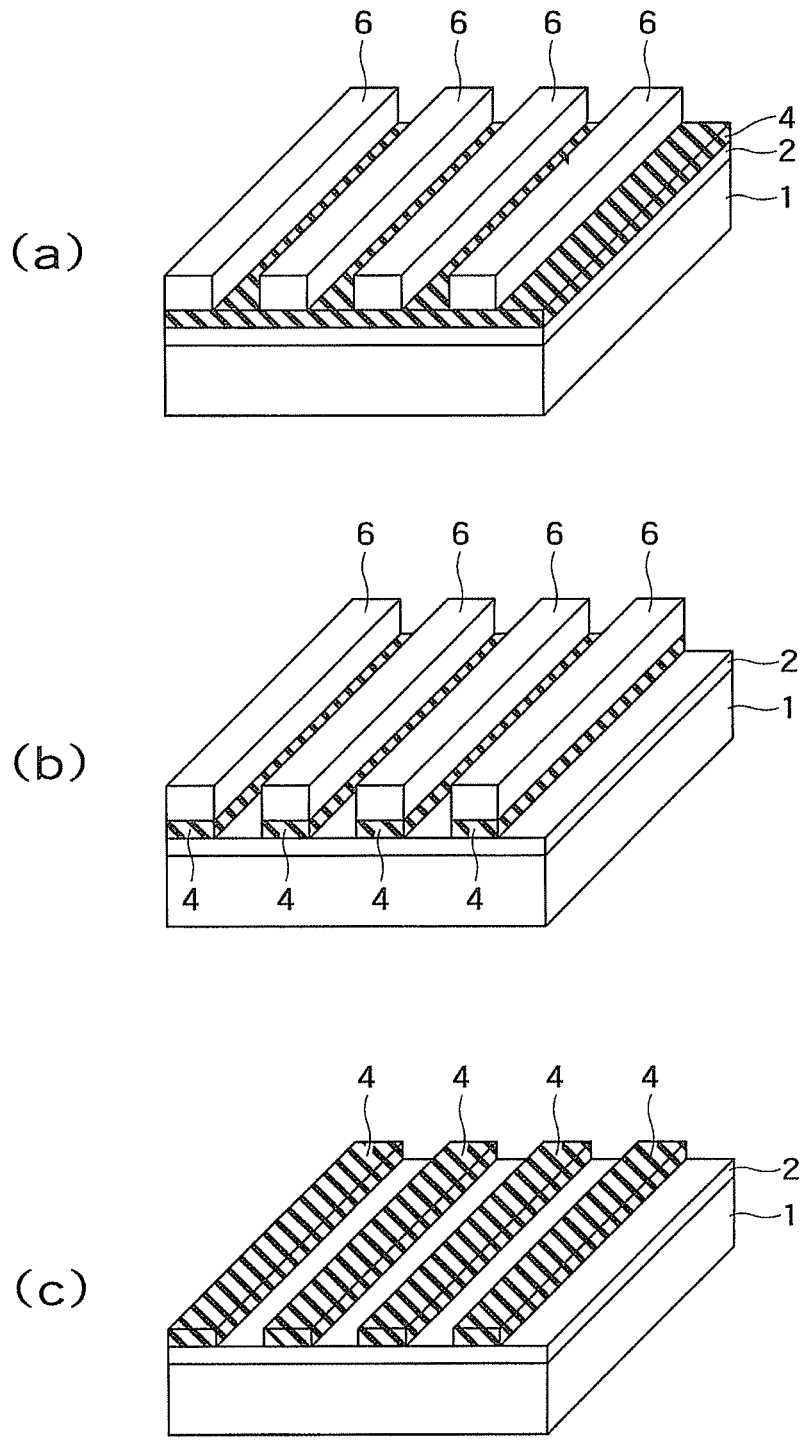
FIGS. 2A (a) to 2A (c) are perspective views showing a polymer alloy pattern formation method according to the second embodiment.
Figure 2B:
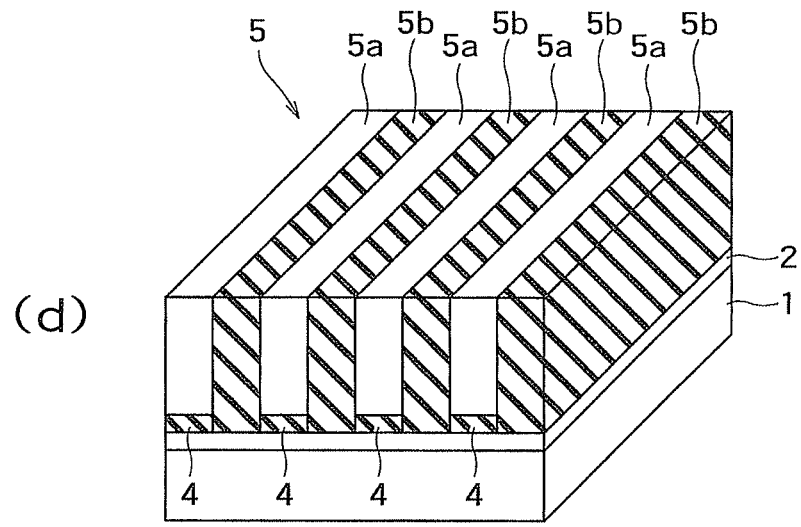
FIGS. 2B (d) and 2B (e) are perspective views showing a polymer alloy pattern formation method according to the second embodiment.
Figure 2B:
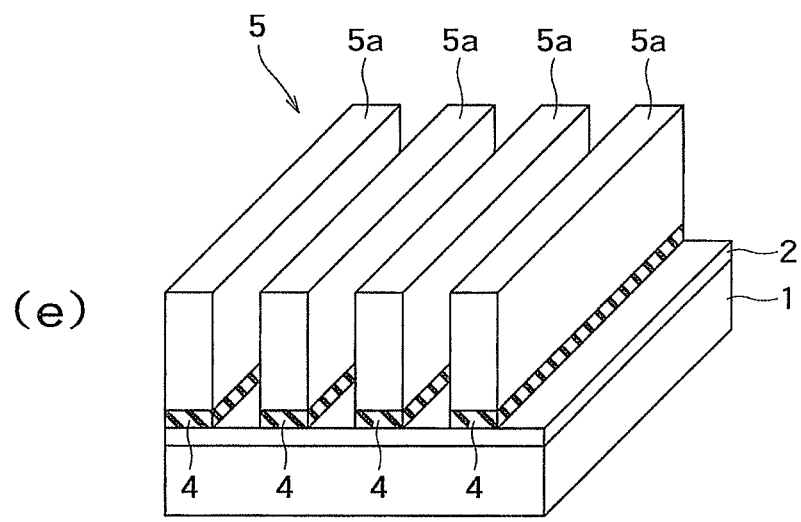

FIGS. 2A (a) to 2A (c) and FIGS. 2B (d) and 2B (e) are perspective views showing a polymer alloy pattern formation method according to the second embodiment.

Process steps for forming the polymer surface layer 4 shown in FIGS. 1A (a) to 1A (c) are performed in the same manner as in the first embodiment.

Next, as shown in FIG. 2A (a), a photoresist 6 having a pattern such as a line-and-space pattern is formed on a polymer film 3.

Next, as shown in FIG. 2A (b), etching is performed on the polymer surface layer 4 by using the photoresist 6 as a mask to transfer the pattern of the photoresist 6 onto the polymer surface layer 4.

Next, as shown in FIG. 2A (c), the photoresist 6 is removed.

Next, as shown in FIG. 2B (d), the polymer alloy 5 having the phase-separated structures is formed on the polymer surface layer 4 and an exposed self-assembled monolayer 2. Here, a first phase 5a of the polymer alloy 5 is formed on the polymer surface layer 4, and a second phase 5b is formed on the exposed self-assembled monolayer 2.

For example, in the case where a contact angle at which the first phase 5a contacts the polymer surface layer 4 is smaller than the contact angle at which the first phase 5a contacts the self-assembled monolayer 2 and a contact angle at which the second phase 5b contacts the self-assembled monolayer 2 is equal to or smaller than the contact angle at which the second phase 5b contacts the polymer surface layer 4 or in the case where a contact angle at which the second phase 5b contacts the self-assembled layer 2 is smaller than the contact angle at which the second phase 5b contacts the polymer surface layer 4 and a contact angle at which the first phase 5a contacts the polymer surface layer 4 is equal to or smaller than a contact angle at which the first phase 5a contacts the self-assembled monolayer 2, the first phase 5a is formed on the polymer surface layer 4, and the second phase 5b is formed on the exposed self-assembled monolayer 2.

After that, as shown in FIG. 2B (e), either one of the first phase 5a or the second phase 5b of the polymer alloy 5 may be selectively removed. In the case where the polymer alloy 5 is formed of 3 or more phases, a part of the phases is removed.

Figure 3:
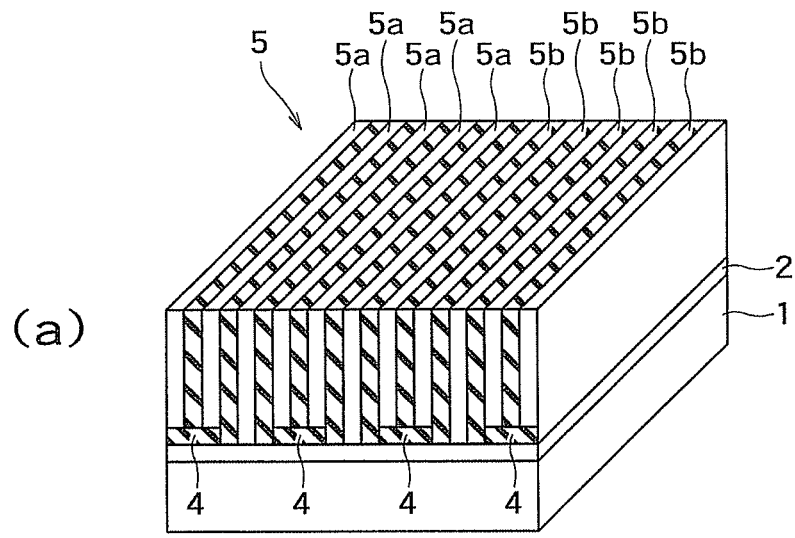
FIGS. 3(a) and 3(b) are perspective views showing a polymer alloy pattern formation method according to the second embodiment.
Figure 3:
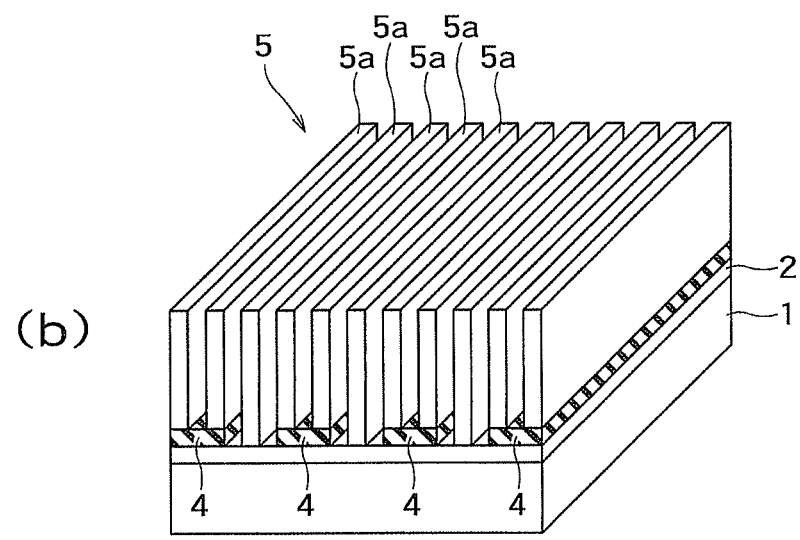

In the case where an original pattern frequency of the first phase 5a and the second phase 5b of the polymer alloy 5 is smaller than the pattern frequency of the patterned polymer surface layer 4, as shown in FIG. 3(a), a plurality of phases of the polymer alloy 5 are formed on a line of the polymer surface layer 4 and a space of the self-assembled monolayer 2. In this case, it is possible to reduce the frequency of the pattern of the phase-separated structures of the polymer alloy 5 to be smaller than the minimum frequency of the pattern of the photoresist 6 by the resolution limit of the exposure device.

After that, as shown in FIG. 3(b), either one of the first phase 5a or the second phase 5b of the polymer alloy 5 is selectively removed to obtain a mask having a microscopic line-and-space pattern which is more microscopic than the resolution limit of the exposure device of the lithography.

Hereinafter, a specific example of the present embodiment will be described. In the specific example, a monolayer of CSBP as the self-assembled monolayer 2 was formed on a silicon wafer as the substrate 1, and a polymer film as the polymer film 3 was formed on the monolayer. The CSBP monolayer and the polymer film were exposed to an ArF excimer laser to form a polymer surface layer as the polymer surface layer 4, and a photoresist as the photoresist 6 was coated and subjected to pattern exposure with an ArF excimer laser and development. Reactive ion etching (RIE) using $O_2$ gas was performed on the polymer surface layer through the resist pattern for patterning, and the resist pattern was peeled off. After that, a pattern of lamellar microphase-separated structures of a block copolymer as the polymer alloy 5 was formed on the thus-formed pattern of the polymer surface layer.

A toluene solution (2.26 mM, 4 ml) of CSBP was dropped onto the silicon wafer corresponding to the substrate 1, followed by dropping a toluene solution (0.247 M, 2 ml) of triethylamine, and then the silicon wafer was left to stand for 1 minute. The solutions were spun off. After that, a whole surface of the silicon wafer was rinsed with cyclohexanone, and a polymer solution for a polymer film corresponding to the polymer film 3 was spin-coated. The polymer solution for polymer film was dissolved into toluene and coated at 2000 rpm. After the coating, baking at 110° C. was performed for 90 seconds to obtain a silicon wafer on which the self-assembled monolayer of CSBP corresponding to the self-assembled monolayer 2 and further the polymer film corresponding to the polymer film 3 were coated.

As a polymer for the polymer film, each of P1071-St, P8007-S, and P8096-S which were polystyrenes (PS) purchased from Polymer Source Inc. was used. P1071-St, P8007-S, and P8096-S respectively have a number average molecular weight (Mn) of 115900, 30000, and 8000, a dispersion degree (Mw/Mn) of 1.04, 1.07, and 1.06, and a ratio of the PS portion to the entire molecular weight (f(PS)) of 0.59. A concentration of each of P1071-St, P8007-S, and P8096-S in the polymer solution was 1.0 wt %.

Next, the obtained polymer film was subjected to exposure using an ArF excimer laser with an exposure amount of 490 $mJ/cm^2$. After the exposure, an entire silicon wafer surface was rinsed with cyclohexanone to obtain a polymer surface layer corresponding to the polymer surface layer 4.

Next, a photoresist corresponding to the photoresist 6 was spin-coated on the obtained polymer surface layer. As the photoresist, AR1687 purchased from JSR Corporation was used. The photoresist was subjected to pattern exposure with an ArF excimer laser. Here, each of line-and-space (1:1) patterns each respectively having a half pitch of 100, 95, 90, 85, 80, 75, 70, or 65 nm was transferred. An exposure amount in the exposure was 25.5 $mJ/cm^2$. After the exposure, development using a 2.38% tetramethylammonium hydroxide solution (AD-10) purchased from Tama Chemicals Co., Ltd. was performed to form each of the line-and-space (1:1) patterns having half pitch of 100, 95, 90, 85, 80, 75, 70, and 65 nm on the photoresist.

After the patterning of the photoresist, $O_2$ plasma etching was performed by using an inductively-coupled plasma reactive ion etching (ICP-RIE) apparatus. The etching was performed by setting a coil power to 10 W and a platen power to 10 W by using the photoresist as a mask for 2 minutes to attain patterned removal of the polymer surface layer. After that, the photoresist was removed by rinsing with cyclohexanone for 1 minute, thereby forming each of the patterns having half pitch of 100, 95, 90, 85, 80, 75, 70, and 65 nm on the polymer surface layer.

A solution of a block copolymer was separately prepared. As the block copolymer, P189-SMMA purchased from Polymer Source Inc., which is a block copolymer (PS-b-PMMA) of polystyrene (PS) and polymethylmethacrylate (PMMA), was used. P189-SMMA has a number average molecular weight (Mn) of PS block and PMMA block of 86500, a dispersion degree (Mw/Mn) of 1.08, and a ratio of the PS portion to the entire molecular weight (f(PS)) of 0.54.

A concentration of a polyethylene glycol monomethyl ether acetate (PGMEA) solution of the block copolymer was adjusted to 2.0 wt %, and the solution was spin-coated on the polymer surface layer at 2000 rpm, followed by baking at 110° C. for 90 seconds on a hot plate, thereby forming a block copolymer corresponding to the polymer alloy 5.

Next, phase separation of the block copolymer into a PS phase formed of a block chain of polystyrene and a PMMS phase formed of a block chain of polymethylmethacrylate was attained by performing annealing under a nitrogen atmosphere. A region of 500 nm×500 nm (500 nm square) of a surface of each of samples was measured with a tapping mode by using an atomic force microscope (Nanoscope III) and using a silicon chip [NCH-50] as a cantilever, and vertical orientation of the lamellar microphase-separated structures was evaluated from the obtained phase image.

As a result, it was confirmed that lamellar microphase-separated structures having patterned orientation of a half pitch of 25 nm was formed in the block copolymer in each of the cases of using P1071-St, P8007-S, and P8096-S.

Further, it was confirmed that, among the block copolymers on the polymer surfaces having the line-and-space (1:1) patterns of the half pitches of 100, 95, 90, 85, 80, 75, 70, and 65 nm, the block copolymer having the line-and-space pattern of the half pitch of 25 nm formed on the polymer surface having the line-and-space pattern of the half-pitch of 75 nm achieved the highest-quality vertical orientation.

Further, the PMMA phase having the higher etching rate than the PS phase was selectively removed by performing RIE using $O_2$ gas on the obtained block copolymer having the phase-separated structures.

Furthermore, the PMMA phase having the higher rate of solution than the PS phase was selectively removed by dipping the obtained block copolymer having the phase-separated structures to a 1:1 mixture solution of isopropyl alcohol (IPA) and methylisobutylketone (MIBK).

Third Embodiment

The third embodiment is different from the second embodiment by a pattern formation method for a polymer surface layer 4. Descriptions of the materials, the production methods, and the like of the component parts which are the same as those of the first and second embodiments are simplified or are not repeated.

Figure 4:
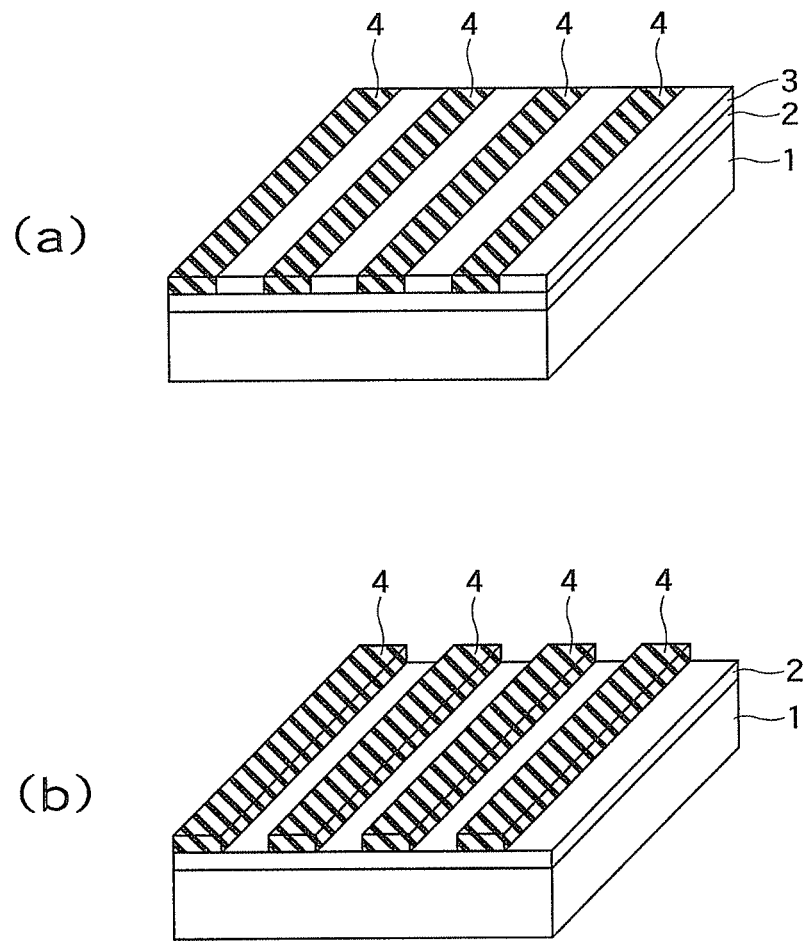
FIGS. 4(a) and 4(b) are perspective views showing a polymer alloy pattern formation method according to the third embodiment.

FIGS. 4(a) and 4(b) are perspective views showing a polymer alloy pattern formation method according to the third embodiment.

Process steps for forming the polymer layer 3 shown in FIGS. 1A (a) and 1A (b) are performed in the same manner as in the first embodiment.

Next, as shown in FIG. 4(a), the polymer film 3 and a self-assembled monolayer 2 are subjected to pattern exposure using the high energy beam to cause chemical bonding (crosslinking) of the polymer film 3 to the self-assembled monolayer 2 in a region which is irradiated with the high energy beam, thereby forming the polymer surface layer 4 on the self-assembled monolayer 2. More specifically, a partial region (pattern region) on the substrate 1 is irradiated with the high energy beam to cause the selective chemical bonding between the polymer film 3 and the self-assembled monolayer 2 in the partial region, thereby forming the polymer surface layer 4. After the formation of the polymer surface layer 4, a portion of the polymer film 3 on the polymer surface layer 4, which is not chemically bonded to the self-assembled monolayer 2, may be removed.

Next, as shown in FIG. 4(b), the polymer film 3 is selectively removed while leaving the polymer surface layer 4.

After that, process steps after forming a polymer alloy 5 are performed in the same manner as in the second embodiment.

In the case where an original pattern frequency of the first phase 5a and the second phase 5b of the polymer alloy 5 is smaller than a pattern frequency of the patterned polymer surface layer 4, a plurality of phases of the polymer alloy 5 are formed on a line of the polymer surface layer 4 and a space of the self-assembled monolayer 2 as shown in FIG. 3(a). In this case, it is possible to reduce the frequency of the pattern of the phase-separated structures of the polymer alloy 5 to be smaller than the minimum frequency of the pattern of the polymer surface layer 4 by the resolution limit of the high energy beam used for the pattern exposure of the polymer film 3 and the self-assembled monolayer 2.

After that, as shown in FIG. 3(b), either one of the first phase 5a or the second phase 5b of the polymer alloy 5 is selectively removed to obtain a mask having a microscopic line-and-space pattern which exceeds microscopic the resolution limit of the high energy beam.

According to the first to third embodiments, the pattern having phase-separated structures of excellent orientation is formed on the polymer alloy in a short time by forming the polymer alloy on the self-assembled monolayer via the polymer surface layer. Further, it is possible to use the polymer alloy as the etching mask having microscopic pattern by selectively removing a part of the phases of the phase-separated structures.

The present invention is not limited to the first to third embodiments, and various modifications are possible within the range which does not deviate from the scope of the invention. Further, the order of process steps of the pattern formation method described in each of the first to third embodiments is not limited to the one described in the foregoing.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern formation method comprising:
    laminating a self-assembled monolayer and a polymer film on a substrate;
    causing chemical bonding between the polymer film and the self-assembled monolayer by irradiation with an energy beam to thereby form a polymer surface layer on the self-assembled monolayer; and
    forming on the polymer surface layer a polymer alloy having a pattern of phase-separated structures.

2. The pattern formation method according to claim 1, further comprising
    selectively removing a part of the phases of the phase-separated structures.

3. The pattern formation method according to claim 2, wherein
    the part of the phases is formed of a block chain which has lower etching resistance than the other phase of the phase-separated structures and is removed by reactive chemical etching.

4. The pattern formation method according to claim 2, wherein
    the part of the phases is formed of a block chain which has higher dissolution in developer than the other phase of the phase-separated structures and is removed by using a developer.

5. The pattern formation method according to claim 1, wherein
    a partial region on the substrate is selectively irradiated with the energy beam to cause selective chemical bonding between the polymer film on the partial region and the self-assembled monolayer, thereby forming the polymer surface layer; and the polymer alloy is formed after removing the polymer film on a region which is not irradiated with the energy beam.

6. The pattern formation method according to claim 5, wherein the phase-separated structures of the polymer alloy are formed of a first phase and a second phase;

the first phase is formed on the polymer surface layer; and the second phase is formed on a surface of the self-assembled monolayer exposed by the removal of the polymer film on the region which is not irradiated with the energy beam.

7. The pattern formation method according to claim 1, further comprising:

coating a photoresist on the polymer surface layer and forming a pattern on the photoresist by pattern exposure using a UV ray or an electron beam and development;

removing by etching, the polymer surface layer on a region which is not coated with the photoresist on which the pattern is formed and transferring the pattern onto the polymer surface layer; and removing the photoresist by using a solvent after the transfer of the pattern onto the polymer surface layer, wherein the polymer alloy is formed after the removal of the photoresist.

8. The pattern formation method according to claim 7, wherein the phase-separated structures of the polymer alloy are formed of a first phase and a second phase;

the first phase is formed on the polymer surface layer; and the second phase is formed on a surface of the self-assembled monolayer exposed by the removal of the polymer film on the region which is not coated with the photoresist.

9. The pattern formation method according to claim 1, wherein the self-assembled monolayer comprises a derivative of a photopolymerization initiator.

10. The pattern formation method according to claim 9, wherein the self-assembled monolayer comprises a compound having benzophenone as a constituent element, and the benzophenone is represented by the following general formula 1:

[Chemical formula 1]

(GENERAL FORMULA 1)

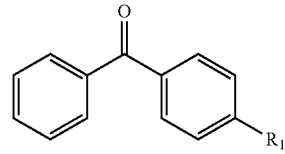

(in the general formula 1, R1 is an alkylsilyl group, a silyl group, an alkylsilyl halide group, a silyl halide group, an alkylthiol group, a thiol group, an alkylhydroxy group, a hydroxy group, an alkylcarboxyl group, a carboxyl group, or an alkyl chain comprising oxygen, halogen, and at least one of an alkylsilyl group, an alkylsilyl halide group, an alkylthio group, or an alkylhydroxy group.)

11. The pattern formation method according to claim 1, further comprising removing an excess portion of the polymer film which is not chemically bonded with the self-assembled monolayer.

12. The pattern formation method according to claim 1, wherein the polymer alloy is formed of at least one kind of a block copolymer, a graft copolymer, and a blend polymer.

13. The pattern formation method according to claim 1, wherein the polymer alloy is a block copolymer having an aromatic structure, an acryl structure, and an alicyclic structure;

a blend polymer comprising at least two kinds of a homopolymer having an aromatic structure, a homopolymer having an acryl structure, and a homopolymer having an alicyclic structure; or a polymer comprising a homopolymer having an aromatic structure, a homopolymer having an acryl structure, or a homopolymer having an alicyclic structure, and the block copolymer.

* * * * *